(12) United States Patent
Kang

(10) Patent No.: US 10,712,574 B2
(45) Date of Patent: Jul. 14, 2020

(54) PERSONAL IMMERSIVE DEVICE

(71) Applicant: LG DISPLAY CO., LTD., Seoul (KR)

(72) Inventor: Yeonsuk Kang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/173,037

(22) Filed: Oct. 29, 2018

(65) Prior Publication Data

US 2019/0129185 A1  May 2, 2019

(30) Foreign Application Priority Data

Oct. 31, 2017  (KR) .................. 10-2017-0144262

(51) Int. Cl.
| | | |
|---|---|---|
| *H04N 5/222* | (2006.01) | |
| *G02B 27/01* | (2006.01) | |
| *H01L 51/52* | (2006.01) | |
| *F21V 8/00* | (2006.01) | |
| *H01L 51/50* | (2006.01) | |
| *H01L 27/32* | (2006.01) | |

(52) U.S. Cl.
CPC ......... *G02B 27/0176* (2013.01); *G02B 6/003* (2013.01); *G02B 27/0172* (2013.01); *H01L 51/5092* (2013.01); *H01L 51/5218* (2013.01); *H01L 51/5265* (2013.01); *H01L 51/5275* (2013.01); *G02B 2027/0118* (2013.01); *G02B 2027/0152* (2013.01); *G02B 2027/0178* (2013.01); *H01L 27/322* (2013.01); *H01L 27/3211* (2013.01); *H01L 2251/558* (2013.01)

(58) Field of Classification Search
CPC ...................................... H04N 5/222
USPC .................................................... 348/333.01
See application file for complete search history.

(56) References Cited

U.S. PATENT DOCUMENTS

| | | | | |
|---|---|---|---|---|
| 5,673,127 A | * | 9/1997 | Takahara | .......... G02F 1/133345 |
| | | | | 348/E9.027 |
| 5,889,567 A | * | 3/1999 | Swanson | .................. G02B 5/02 |
| | | | | 257/E21.011 |
| 6,421,031 B1 | * | 7/2002 | Ronzani | ............... G02B 27/017 |
| | | | | 345/8 |

(Continued)

FOREIGN PATENT DOCUMENTS

| | | |
|---|---|---|
| JP | 2017111363 A | 6/2017 |
| KR | 20090036483 A | 4/2009 |
| KR | 20170052766 A | 5/2017 |

OTHER PUBLICATIONS

Office Action dated Sep. 14, 2018 issued in the corresponding Korean Patent Application No. 10-2017-0144262, pp. 1-6.

*Primary Examiner* — Kaveh C Kianni

(74) *Attorney, Agent, or Firm* — Polsinelli PC

(57) ABSTRACT

A personal immersive device that can be worn on the user's head comprises a display panel having an active area where first and second pixels are arranged and a projection lens provided on the display panel, with a smaller area than the active area, and having a first lens portion allocated for the first pixel and a second lens portion allocated for the second pixel. The first and second pixels each comprise a first electrode, a second electrode, and an organic compound layer interposed between the first electrode and the second electrode and emitting light of the same color. The distance between the first and second electrodes of the first pixel is different from the distance between the first and second electrodes of the second pixel.

13 Claims, 14 Drawing Sheets

(56) References Cited

U.S. PATENT DOCUMENTS

| | | | | |
|---|---|---|---|---|
| 6,992,718 | B1* | 1/2006 | Takahara | G02B 23/14 |
| | | | | 348/333.09 |
| 9,395,548 | B2* | 7/2016 | Kroon | G09G 3/3208 |
| 2001/0017604 | A1* | 8/2001 | Jacobsen | G02B 25/002 |
| | | | | 345/27 |
| 2004/0066363 | A1* | 4/2004 | Yamano | G09G 3/20 |
| | | | | 345/98 |
| 2008/0106591 | A1* | 5/2008 | Border | H04N 7/144 |
| | | | | 348/14.01 |
| 2008/0106628 | A1* | 5/2008 | Cok | H04N 7/144 |
| | | | | 348/333.01 |
| 2008/0106629 | A1* | 5/2008 | Kurtz | H04N 7/144 |
| | | | | 348/333.01 |
| 2008/0165267 | A1* | 7/2008 | Cok | H04N 7/144 |
| | | | | 348/333.01 |
| 2014/0292732 | A1* | 10/2014 | Niioka | G02B 27/22 |
| | | | | 345/204 |

\* cited by examiner

PERSONAL IMMERSIVE DEVICE

CROSS REFERENCE TO RELATION APPLICATION

This application claims the priority benefit of Korean Patent Application No. 10-2017-0144262 filed on Oct. 31, 2017, which is incorporated herein by reference in its entirety for all purposes as if fully set forth herein.

BACKGROUND OF THE DISCLOSURE

Field of the Disclosure

The present disclosure relates to a personal immersive device for virtual reality and augmented reality.

Description of the Background

Virtual reality and augmented reality technologies are used in various industries such as military, architecture, tourism, movies, multimedia, gaming, etc.

Virtual reality is a content medium that allows users to feel like they are interacting with a particular environment and situation, by using virtual images. Augmented reality is a content medium that allows users to view both virtual objects and real-world objects at the same time by providing virtual information about virtual images in combination with real-world information about physical, real-world environment. Virtual reality and augmented reality are different from each other, depending on whether users can view real-world environments and situations.

A personal immersive device is a device that implements the aforementioned virtual reality or augmented reality, that can be worn the user's head. Various types of personal immersive devices are developed, including HMD (head mounted display), FMD (face mounted display), EGD (eye glasses-type display), etc. The personal immersive device is able to present vivid and realistic images by delivering 2D and 3D images to the user.

The personal immersive device delivers an image presented on a display panel via an optical system, rather than directly to the user's eyes. Thus, the personal immersive device further comprises elements such as a lens portion and optical guiding portion for guiding light from the display panel to the user's eyes.

Since such a personal immersive device is worn on the user's head, the device needs to be lightweight and small in order to improve user convenience. However, there are limitations in making lightweight and small personal immersive devices, due to the weights of the aforementioned lens portion and optical guiding portion and the need for space for them.

SUMMARY

The present disclosure provides a personal immersive device that can be made small and lightweight and minimize light loss.

In one aspect, a personal immersive device that can be worn on the user's head comprises a display panel having an active area where first and second pixels are arranged and a projection lens provided on the display panel, with a smaller area than the active area, and having a first lens portion allocated for the first pixel and a second lens portion allocated for the second pixel. The first and second pixels each comprise a first electrode, a second electrode, and an organic compound layer interposed between the first electrode and the second electrode and emitting light of the same color. The distance between the first and second electrodes of the first pixel is different from the distance between the first and second electrodes of the second pixel.

A light distribution characteristic of the first pixel is different from a light distribution characteristic of the second pixel.

The first pixel has a light distribution characteristic with which the amount of light traveling towards the front is maximum. The second pixel has a light distribution characteristic with which the amount of light traveling at a preset angle of tilt from the front is maximum.

The active area comprises an effective area overlapping with the projection lens and an ineffective area not overlapping with the projection lens.

The effective area is defined to be at the center of the active area or more to one side of the active area.

The personal immersive device further comprises color filers. The light emitted from the organic compound layer enters the projection lens through the color filters.

The display panel comprises a first group comprising a plurality of first pixels; and a second group comprising a plurality of second pixels. The distance between the first and second electrodes of the first pixels in the first group is the same for all. The second pixels in the second group have the same cavity thickness.

The organic compound layer comprises an emission layer and at least one of common layers comprising a hole injection layer, a hole transport layer, an electron transport layer, and an electron injection layer. The common layer of the first pixel and the common layer of the second pixel are different in thickness.

The first electrode comprises a reflective layer and a transparent conductive layer located on the reflective layer. Either the first pixel or the second pixel further comprises a dielectric layer located between the reflective layer and the transparent conductive layer.

The first electrode of the first and the second pixels comprises a reflective layer, a transparent conductive layer located on the reflective layer and a dielectric layer located between the reflective layer and the transparent conductive layer. The dielectric layer of the first pixel and the dielectric layer of the second pixel are different in thickness.

The first electrode is a reflective electrode. The second electrode is a semi-transmissive electrode.

The personal immersive device further comprises an optical guiding portion that guides the light delivered from the projection lens to the user's eye.

In another aspect, a personal immersive device that can be worn on the user's head, comprises a display panel having an active area where pixels are arranged and a projection lens on which the light from the pixels incident. The first and second pixels, which emit light of the same color among the pixels, have different cavity thicknesses.

The projection lens comprises a first lens portion allocated for the first pixel. The pitch of the first lens portion is smaller than the pitch of the first pixel.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Figure 1:
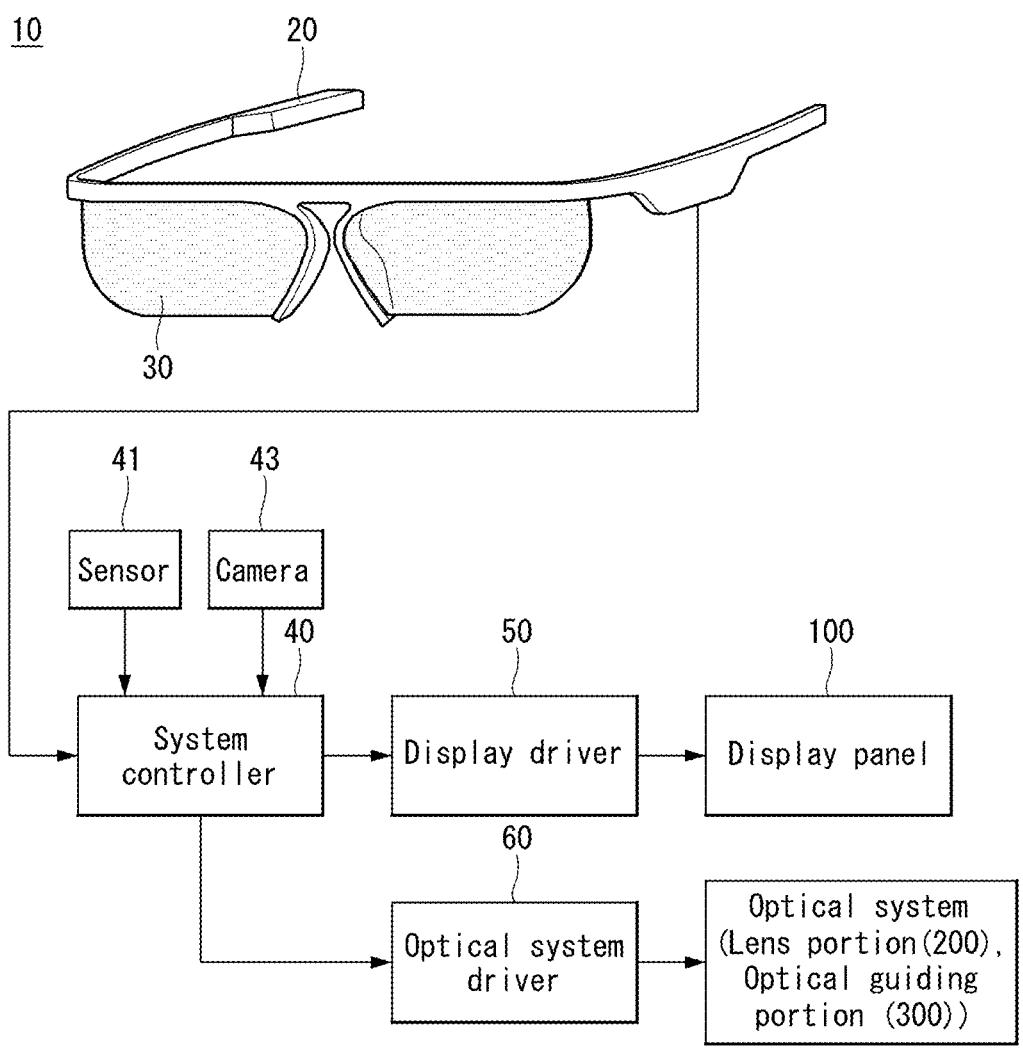
FIG. 1 is a perspective view and block diagram of a personal immersive device according to the present disclosure.

Hereinafter, exemplary aspects of the present disclosure will be described in detail with reference to the attached drawings. Throughout the specification, like reference numerals denote substantially like components. In describing the present disclosure, a detailed description of known functions or configurations related to the present disclosure will be omitted when it is deemed that they may unnecessarily obscure the subject matter of the present disclosure.

It will be understood that, although the terms "first", "second", etc. may be used herein to describe various elements, these elements are not limited by these terms. These terms are used to distinguish one element from another element.

FIG. 1 is a perspective view and block diagram of a personal immersive device according to the present disclosure.

Referring to FIG. 1, a personal immersive device 10 according to the present disclosure comprises a frame 20 that can be worn on the user's head. The drawing depicts, but not limited to, a frame 20 having the approximate shape of glasses by way of example. The personal immersive device 10 may further comprise a lens 30 fitted to the frame 20 and corresponding to at least one of the user's eyes. When the personal immersive device 10 implements augmented reality, the user may view a physical, real-world environment (or space) through the lens 30.

The personal immersive device 10 comprises a system controller 40, a display driver 50, a display panel 100, and an optical projection system. The system controller 40, display driver 50, display panel 100, and optical projection system may be accommodated in an internal space provided in the frame 20.

The system controller 40 further comprises an external device interface connected to an external video source, a user interface for receiving user commands, and a power supply for generating electrical power required to drive the personal immersive device 10. The external device interface, user interface, and power supply are omitted in the drawings. The external device interface may be implemented as a variety of well-known interface modules such as Universal Serial Bus (USB) and High-Definition Multimedia Interface (HDMI). The system controller 40 may be connected to a sensor 41, a camera 43, etc.

The system controller 40 may send image data to the display driver 50 and control the display driver 50. The image data sent to the display driver 50 may comprise virtual reality data, augmented reality data, image data of a real-world outdoor environment captured by the camera 43, and other image data received from an external video source. Virtual/augmented reality data may be sent in 2D or 3D format to the display driver 50. Data in 3D format is split into left-eye image data and right-eye image dat. The system controller 40 may receive virtual reality image data from a memory module or external video source via the external device interface. Virtual/augmented reality image data is image data that is distinct from outdoor environments. Augmented reality data may comprise information obtained by the sensor 41 and the camera 43.

The sensor 41 may comprise various sensors such as a gyro-sensor, an acceleration sensor, etc. The system controller 40 may properly adjust image data by using information obtained by the sensor 41. For example, the system controller 40 may adjust image data such that, when a user wearing the personal immersive device 10 moves up, down, left, and right, images delivered to the eyes are moved in conjunction with the user's movement. The camera 43 may capture an outdoor environment and send image data of the outdoor environment to the system controller 40. The system controller 40 may properly adjust image data by using information obtained by the camera 43.

The display driver 50 applies image data from the system controller 40 to the pixels on the display panel 100. The display panel 100 comprises data lines to which data voltages are applied, and gate lines (or scan lines) to which gate pulses (or scan pulses) are applied. The pixels may be defined by, but not limited to, the intersections of the data lines and the gate lines. Each pixel comprises an organic light-emitting diode.

The display driver 50 comprises a data driver, a gate driver, and a timing controller. The data driver converts data of an input image into gamma-compensated voltages to generate data voltages, and outputs the data voltages to the data lines. The gate driver sequentially outputs gate pulses to the gate lines, in synchronization with the data voltages. The timing controller sends data of an input image, received from the system controller 40, to the data driver. The timing controller receives timing signals from the system controller 40, in synchronization with the input image data, and controls the operation timings of the data driver and gate driver based on these timing signals.

The personal immersive device 10 may further comprise an optical system driver 60 that controls an optical guiding portion 300. The system controller 40 may enlarge, shrink, move, rotate, or shift images delivered to the eyes by controlling the optical system driver 60 by a preset application program. For example, when guiding light to the eyes from virtual/augmented reality images presented on the display panel 100, the optical system driver 60 may control the lens portion 200 and/or the optical guiding portion 300 so as to shift the position of the light in response to a preset signal from the system controller 40.

Figure 2:
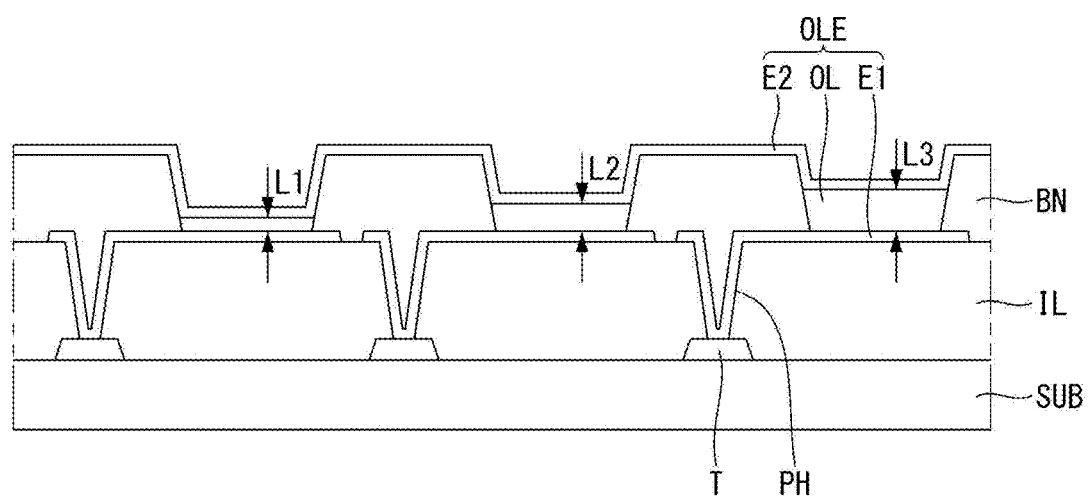
FIG. 2 is a cross-sectional view of an example pixel structure on a display panel.

FIG. 2 is a cross-sectional view of an example pixel structure on a display panel.

Referring to FIG. 2, a display panel according to an exemplary aspect of the present disclosure comprises pixels arranged in an active area. The pixels may comprise, but not limited to, pixels of red (R), green (G), and blue (B).

The display panel comprises a substrate SUB. Thin-film transistors T allocated to the pixels and organic light-emitting diode OLE connected to the thin-film transistors T are arranged on the substrate SUB. Neighboring pixels may be separated by a bank BN (or pixel defining layer), and the planar shape of each pixel PIX may be defined by the bank BN. Thus, the position and shape of the bank BN may be properly chosen in order to form pixels PIX having a preset planar shape.

The thin-film transistors T may have various structures, including a bottom-gate structure, a top-gate structure, and a double-gate structure. That is, a thin-film transistor T may comprise a semiconductor layer, a gate electrode, and source/drain electrodes, and the semiconductor layer, gate electrode, and source/drain electrodes may be arranged on different layers, with at least one insulating layer interposed therebetween.

At least one insulating layer IL may be interposed between the thin-film transistor T and the organic light-emitting diode OLE. The insulating layer IL may comprise a planarization layer made of an organic matter such as photoacryl, polyimide, benzocyclobutene resin, acrylate resin, etc. The planarization layer may planarize the surface of the substrate SUB where the thin-film transistors T and various signal lines are formed. Although not shown, the insulating layer may further comprise a passivation layer composed of a silicon oxide film (SiOx), a silicon nitride film (SiNx), or multiple layers of them, and the passivation layer may be interposed between the planarization layer and the thin-film transistor T. The thin-film transistor T and the organic light-emitting diode OLE may be electrically connected via a pixel contact hole PH penetrating one or more the insulating layer IL.

The organic light-emitting diode OLE comprises first and second electrodes E1 and E2 facing each other, and an organic compound layer OL interposed between the first electrode E1 and the second electrode E2. The first electrode E1 may be an anode, and the second electrode may be a cathode.

The first electrode E1 may be composed of a single layer or multiple layers. The first electrode E1 further comprises a reflective layer to function as a reflective electrode. The reflective layer may be made of aluminum (Al), copper (Cu), silver (Ag), nickel (Ni), or an alloy of these elements, or APC (silver/palladium/copper alloy). In an example, the first electrode E1 may be formed of triple layers of ITO/Ag alloy/ITO. The first electrode E1 may be dividedly disposed corresponding to each subpixel.

The bank BN for separating neighboring pixels is positioned on the substrate SUB where the first electrode E1 is formed. The bank BN may be made of an organic matter such as polyimide, benzocyclobutene resin, acrylate resin, etc. The bank BN comprises openings for exposing most of the center of the first electrode E1. The parts of the first electrode E1 exposed by the bank BN may be defined as light emission areas. The bank BN may expose the center the first electrode E1 and be configured in such a way as to cover the side edges of the first electrode E1.

An organic compound layer OL is formed on the substrate SUB where the bank BN is formed. The organic compound layer OL of a corresponding color is positioned in each pixel. That is, each pixel may comprise an organic compound layer OL of either red (R), green (G), or blue (B). The organic compound layer OL comprises an emission layer, and may further comprise at least one of common layers such as a hole injection layer, a hole transport layer, an electron transport layer, and an electron injection layer.

A second electrode E2 is formed on the substrate SUB where the organic compound layer OL is formed. The second electrode E2 may be made of a thin opaque conductive material such as magnesium (Mg), calcium (Ca), aluminum (Al), and silver (Ag), and function as a semi-transmissive electrode. The second electrode E2 may be integrally formed over the substrate SUB to cover the pixels.

Each of the pixels on the display panel according to the present disclosure applies a micro-cavity that uses a space between the first electrode E1 and the second electrode E2 as an optical cavity. That is, in the present disclosure, constructive interference is produced for a target wavelength by adjusting the thickness of the space between the first and second electrodes E1 and E2 (in other words, the thickness of the space (or gap) between the reflective layer and the semi-transmissive layer; hereinafter, "cavity thickness"), which changes the emission spectrum and improves optical efficiency and color reproduction. Accordingly, different pixels R, G, and B, which emit light of different colors, may have different cavity thicknesses L1, L2, and L3 for different target wavelengths.

Figure 3:
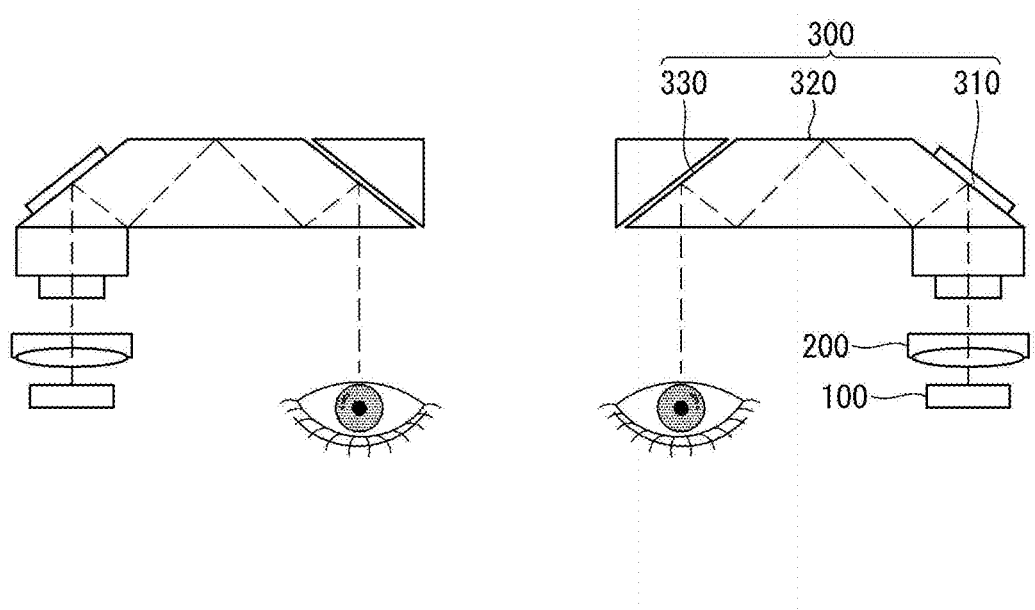
FIG. 3 is a schematic view of an optical system for a personal immersive device according to the present disclosure.

FIG. 3 is a schematic view of an optical system for a personal immersive device according to the present disclosure.

Referring to FIG. 3, the personal immersive device comprises an optical projection system for delivering light from an image presented on the display panel to the user's eyes. The optical projection system comprises a lens portion 200 and an optical guiding portion 300, and guides the image presented on the display panel to the user's eyes through a proper switching or reflection process.

The lens portion 200 directs the light delivered from the display panel to the optical guiding portion 300. The lens portion 200 comprises a projection lens (210 of FIG. 4). The projection lens may collimate (or focus) the light delivered from the display panel and may project the collimated light onto the optical guiding portion 300. The lens portion 200 may be composed of a single lens or a combination of multiple lenses.

The optical guiding portion 300 guides light incident from the lens portion 200 to send it towards the user's eyes. In an example, the optical guiding portion 300 may comprise a first reflecting portion 310, a light guide portion 320, and a second reflecting portion 330. The first reflecting portion 310 may reflect the light delivered from the lens 200 and guide it to the light guide portion 320. The light guide portion 320 guides the light delivered from the lens portion 200 to the second reflecting portion 330. Light incident on the light guide portion 320 travels towards the second reflecting portion 330 via total reflection within the light guide portion 320. The second reflecting portion 330 reflects the light traveling inside the light guide portion 320 via total reflection and sends it towards the user's eye.

Figure 4:
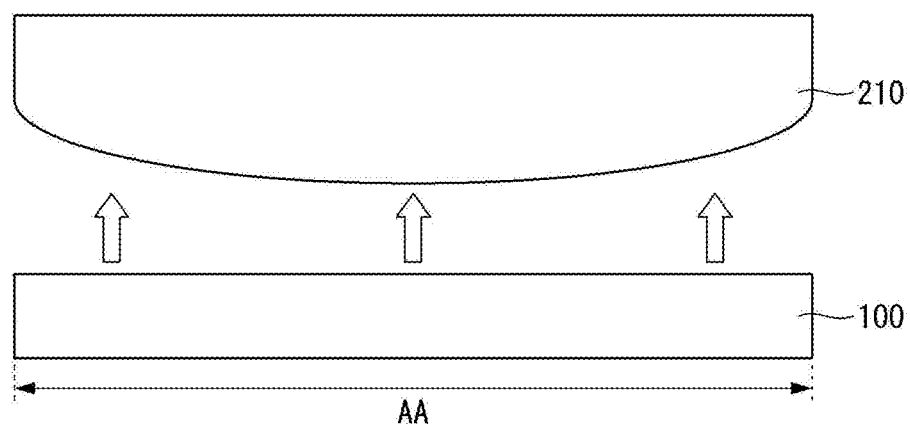
FIG. 4 is a view illustrating the positional relationship between a projection lens and a display panel according to a comparative example.
Figure 5:
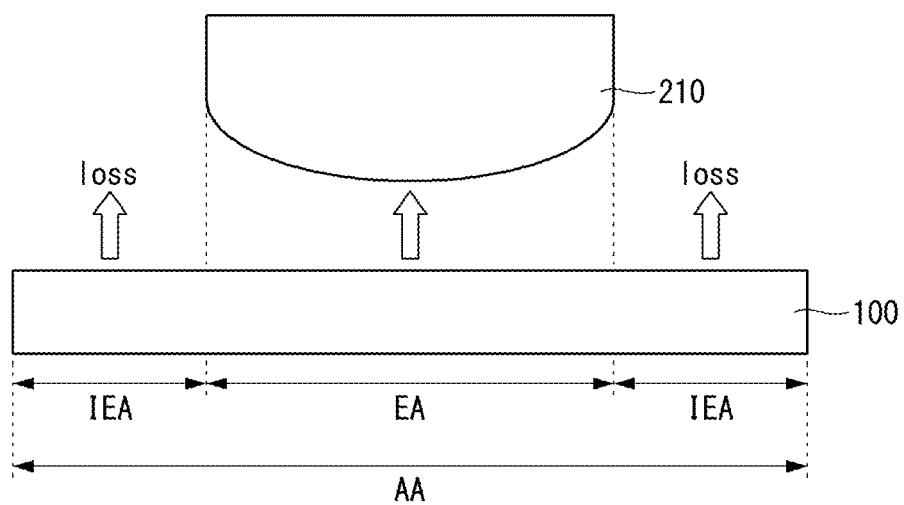
FIGS. 5 and 6 are views illustrating the positional relationship between a projection lens and a display panel according to the present disclosure.
Figure 6:
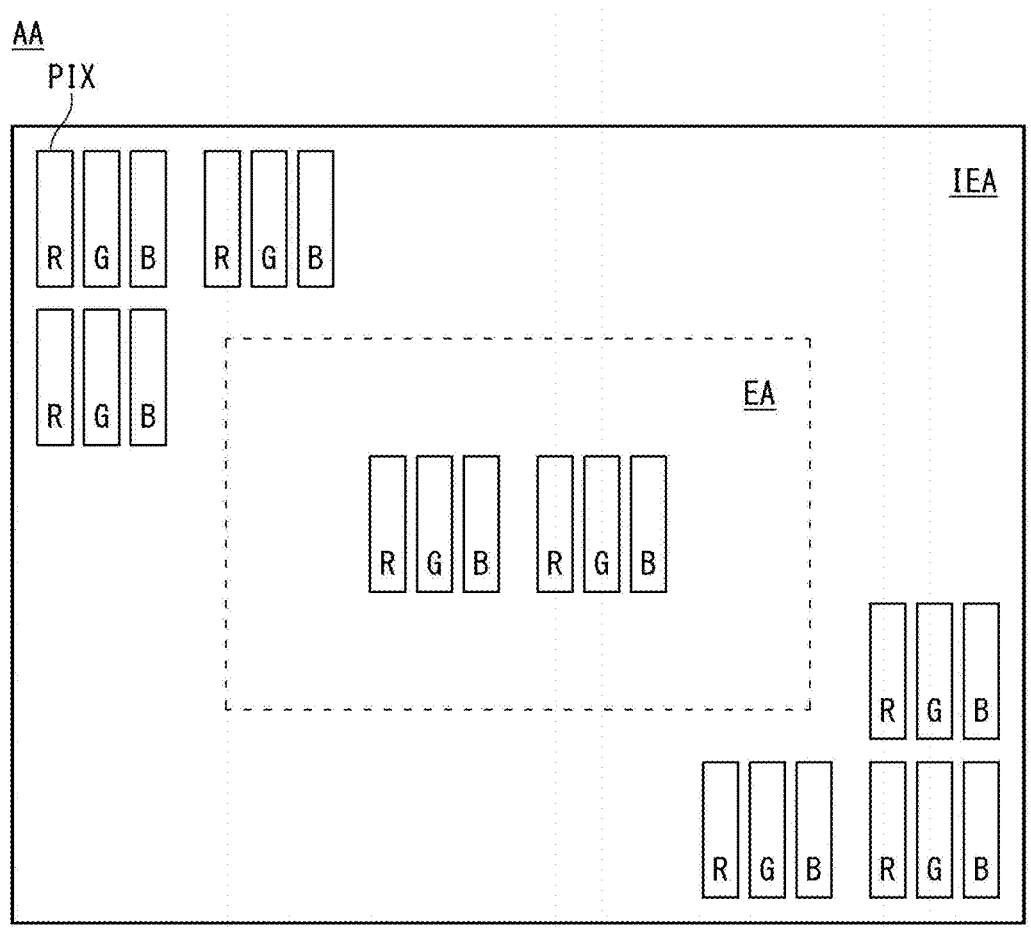

FIG. 4 is a view illustrating the positional relationship between a projection lens and a display panel according to a comparative example. FIGS. 5 and 6 are views illustrating the positional relationship between a projection lens and a display panel according to the present disclosure.

Referring to FIG. 4, the projection lens 210 is configured to face the display panel 100, corresponding to the active area AA of the display panel 100. The projection lens 210 is positioned in the direction in which the light emitted from the display panel 100 is directed. The projection lens 210 may have an area (or size) corresponding to the active area AA of the display panel 100. In this case, the projection lens 210 may easily receive the light emitted from each of the pixels arranged in the active area AA. That is, if the projection lens 210 is configured to have substantially the same area as the active area AA, its active-area facing area may be sufficiently large. Thus, most of the light emitted from the pixels in the active area AA towards where it is directed may enter the projection lens 210.

Since the personal immersive device is worn on the user's head, the device needs to be lightweight and small in order to improve user convenience. To this end, the size of the display panel 100 may be reduced to make the personal immersive device more lightweight and smaller, but this approach has its limitations because the display panel 100 requires a fixed size for efficiency and resolution reasons.

Referring to FIGS. 5 and 6, in the exemplary aspect of the present disclosure, the projection lens 210 constituting the optical system should be reduced in size, in order to make the personal immersive device more lightweight and smaller. That is, the projection lens 210 according to the exemplary aspect of the present disclosure has a smaller area than the active area AA. Thus, the area of the projection lens 210 facing the active area AA is small compared to the structure shown in FIG. 4.

The overlapping region between the active area AA and the projection lens 210 may be defined as an effective area EA, and the non-overlapping region may be defined as an ineffective area IEA. Although the drawings illustrate that the effective area EA is defined to be at the center of the active area AA, the present disclosure is not limited to it. The effective area EA may be defined to be more to one side of the active area AA.

If the area of the projection lens 210 is reduced as in the exemplary aspect of the present disclosure, the ineffective area IEA is created. Most of the light emitted from the pixels in the ineffective area IEA exits without entering the projection lens 210. Accordingly, in a typical pixel structure, light loss in the ineffective area IEA is evitable.

An exemplary aspect of the present disclosure proposes a novel structure that can significantly reduce light loss as well as the size of the projection lens 210 constituting the optical system, in order to make the personal immersive device more lightweight and smaller.

Figure 7:
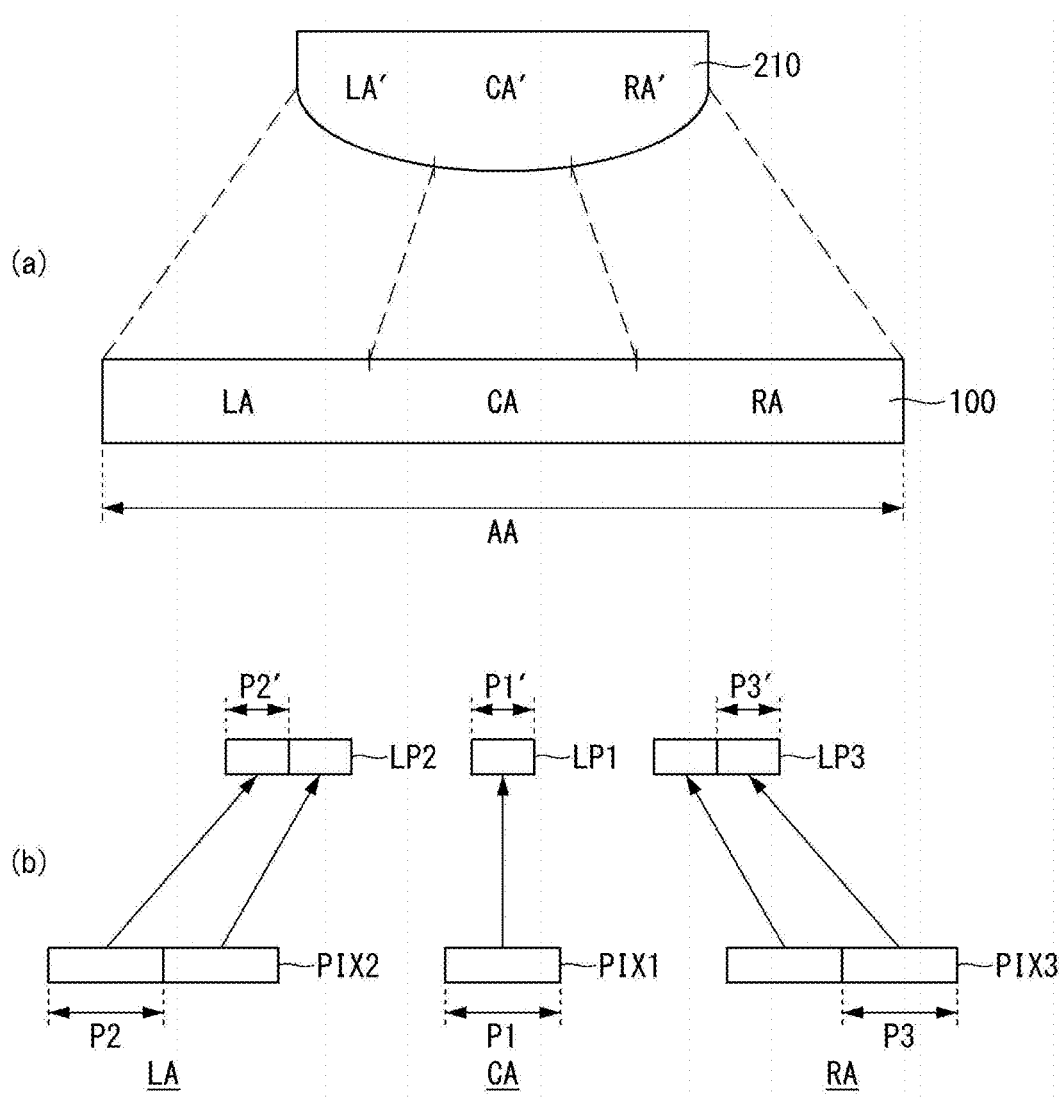
FIGS. 7 and 8 are views illustrating the positional relationship between a projection lens and a display panel according to the present disclosure.
Figure 8:
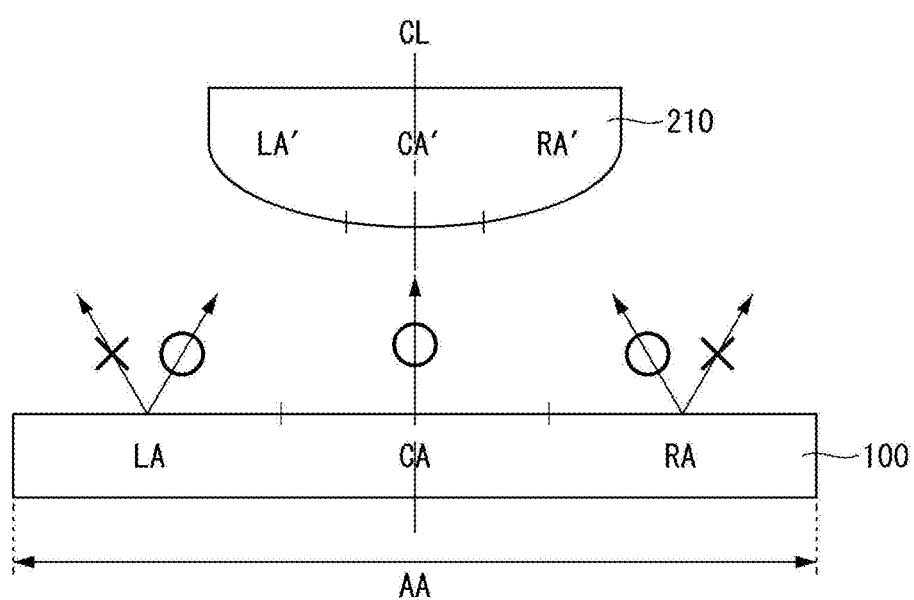
Figure 9:
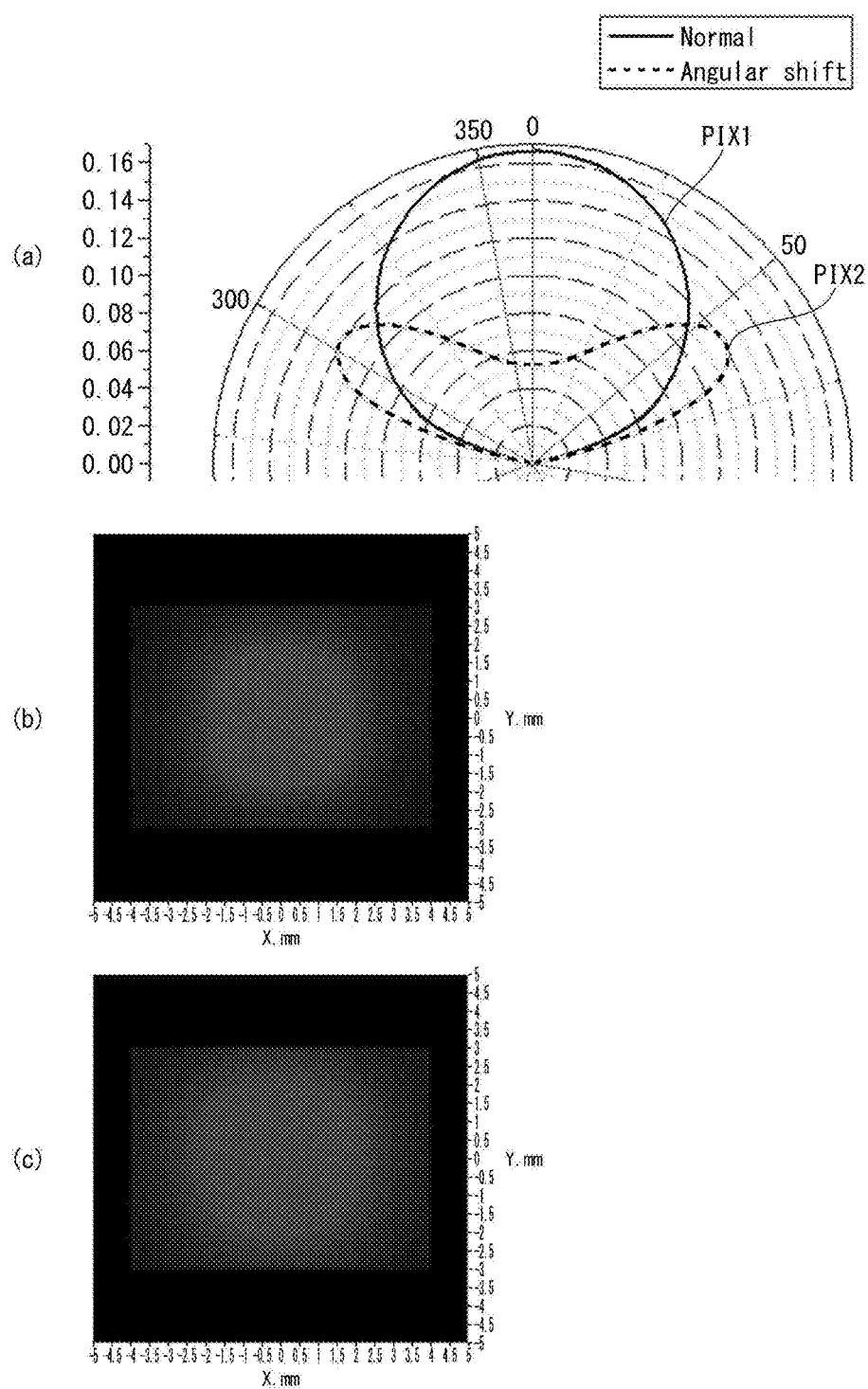
FIG. 9 is simulation results showing the variation of light distribution characteristics with cavity thickness.

FIGS. 7 and 8 are views illustrating the positional relationship between a projection lens and a display panel according to the present disclosure. FIG. 9 is simulation results showing the variation of light distribution characteristics with cavity thickness.

The active area AA of the display panel 100 may be divided into A, B, and C areas CA, LA, and RA, the projection lens 210 may be divided into A', B', and C' areas CA', LA', and RA' corresponding to the A, B, and C areas CA, LA, and RA of the active area AA. A first pixel PIX1, second pixel PIX2, and third pixel PIX3 to be described below are pixels arranged in the A, B, and C areas CA, LA, and RA, respectively, that emit light of the same color.

Referring to FIG. 7, some of the light delivered from the pixel PIX in the A area CA is directed towards the A' area CA' of the projection lens 210. Light emitted from the first pixel PIX1 with a preset pitch P1 and traveling toward the projection lens 210 is controlled to enter a first lens portion LP1 allocated for the first pixel PIX1 and having a preset pitch P1'. Since the projection lens 210 has a smaller area than the active area AA, the pitch P1' of the first lens portion LP1 is smaller than the pitch P1 of the first pixel PIX1. The orientation direction in which the light emitted from the first pixel PIX1 is directed may be controlled. For example, the light emitted from the first pixel PIX1 may be directed toward the front. Thus, the light emitted from a pixel adjacent to the first pixel PIX1 does not enter the first lens portion LP1, thus causing no color mixture defect.

The B area LA may be defined on the left side of the A area CA. Part of the light delivered from the pixel PIX in the B area LA is directed towards the B' area LA' of the projection lens 210. Light emitted from the second pixel PIX2 with a preset pitch P2 and traveling toward the projection lens 210 is controlled to enter a second lens portion LP2 allocated for the second pixel PIX2 and having a preset pitch P2'. Since the projection lens 210 has a smaller area than the active area AA, the pitch P2' of the second lens portion LP2 is smaller than the pitch P2 of the second pixel PIX2. The orientation direction in which the light emitted from the second pixel PIX2 is directed may be controlled. For example, the light emitted from the second pixel PIX2 may be tilted to the right at a preset angle $\theta1$ from the front. Thus, the light emitted from a pixel adjacent to the second pixel PIX2 does not enter the second lens portion LP2, thus causing no color mixture defect.

The C area RA may be defined on the right side of the A area CA. Part of the light delivered from the pixel PIX in the C area RA is directed towards the C' area RA' of the projection lens 210. Light emitted from the third pixel PIX3 with a preset pitch P3 and traveling toward the projection lens 210 is controlled to enter a third lens portion LP3 allocated for the third pixel PIX3 and having a preset pitch P3'. Since the projection lens 210 has a smaller area than the active area AA, the pitch P3' of the third lens portion LP3 is smaller than the pitch P3 of the third pixel PIX3. The orientation direction in which the light emitted from the third pixel PIX3 is directed may be controlled. For example, the light emitted from the third pixel PIX3 may be tilted to the left at a preset angle $\theta2$ from the front. Thus, the light emitted from a pixel adjacent to the third pixel PIX3 does not enter the third lens portion LP3, thus causing no color mixture defect.

Referring to FIG. 8, in the present disclosure, the amount of light emitted from the pixels PIX towards where it is directed may be controlled by varying cavity thickness. That is, in the present disclosure, the amount of light from each pixel PIX towards where it is directed may be increased by varying the cavity thickness of the pixels PIX in accordance with the distance from the center line CL. Here, the center line CL refers to a virtual line that runs across the center of the projection lens 210 and the center of the active area AA. In other words, the cavity thickness of each pixel PIX may be varied with position, and each pixel PIX may have a cavity thickness that provides the light distribution characteristic with which the amount of light towards where it is directed can be maximized.

Referring to FIG. 9, the cavity structure of the first pixel PIX1 may be set to have a cavity thickness at which the amount of light traveling towards the front can be maximized. In this case, the light distribution characteristics of the cavity structure of the first pixel PIX1 may be as shown in the full line parts of (a) of FIGS. 9 and (b) of FIG. 9. The light emitted from the first pixel PIX1 and directed towards the front enters the projection lens 210 and is guided to the user's eye through the optical system.

The cavity structure of the second pixel PIX2 may be set to have a cavity thickness at which the amount of light traveling at a preset angle $\theta1$ (+55° in the test) of tilt from the front is maximum. In this case, the light distribution characteristics of the cavity structure of the second pixel PIX2 may be as shown in the dotted line parts of (a) of FIGS. 9 and (c) of FIG. 9. As can be seen from the light distribution characteristics, the light emitted from the pixels PIX comprises a component that is tilted at an angle of (+) degrees (a tilt to the right) and a component that is tilted at an angle of (−) degrees (a tilt to the left). The light emitted from the second pixel PIX2 and directed at a tilt of (+) degrees enters the projection lens 210 and is guided to the user's eye through the optical system. The light emitted from the second pixel PIX2 contributes to image representation when directed at a tilt of (+) degrees.

The cavity structure of the third pixel PIX3 may be set to have a cavity thickness at which the amount of light traveling at a preset angle θ2 (−55° in the test) of tilt from the front is maximum. In this case, the light distribution characteristics of the cavity structure of the third pixel PIX3 may be as shown in the dotted line parts of (a) of FIGS. 9 and (c) of FIG. 9. As can be seen from the light distribution characteristics, the light emitted from the pixels PIX comprise a component tilted at an angle of (+) degrees (a tilt to the right) and a component tilted at an angle of (−) degrees (a tilt to the left). The light emitted from the third pixel PIX3 and directed at a tilt of (−) degrees enters the projection lens 210 and is guided to the user's eye through the optical system. The light emitted from the third pixel PIX3 contributes to image representation when directed at a tilt of (−) degrees.

As can be seen from the simulation results, the light distribution characteristics may vary for each pixel PIX if each pixel PIX has a different cavity thickness. Accordingly, in the present disclosure, when a target pixel PIX needs to be directed towards the front, the pixel PIX may have a preset cavity thickness so that the emitted light is collected towards the front, and when the pixel PIX needs to be directed at a tilt from the front, the pixel PIX may have a preset cavity thickness so that the emitted light is collected in the tilt direction. Thus, the exemplary aspect of the present disclosure has the advantage of significantly reducing light loss, as well as making the personal immersive device more lightweight and smaller, by reducing the size of the projection lens 210.

Figure 10:
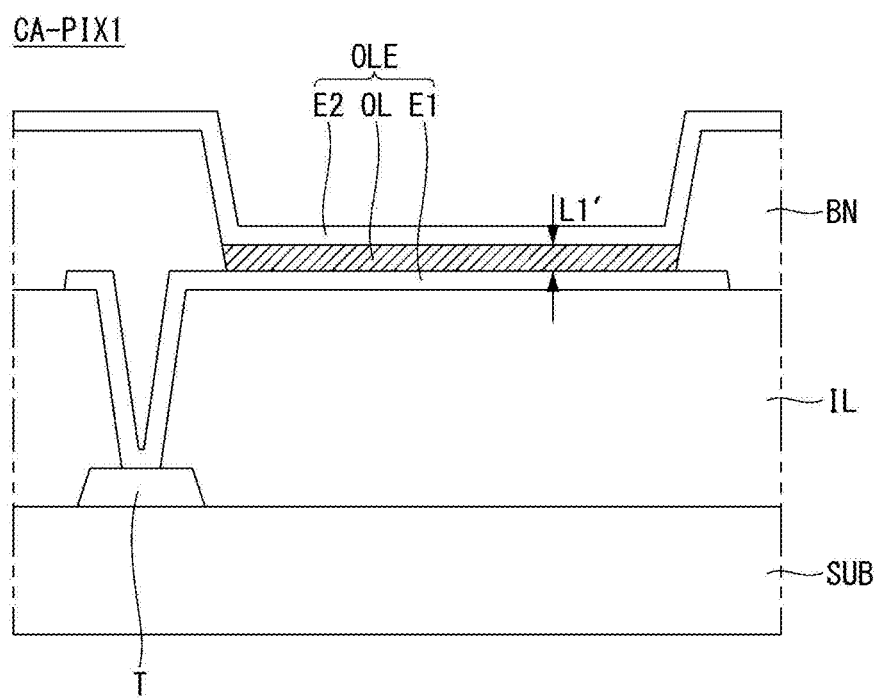
FIGS. 10 and 11 are schematic cross-sectional views of structures of first and second pixels with different cavity thicknesses.
Figure 11:
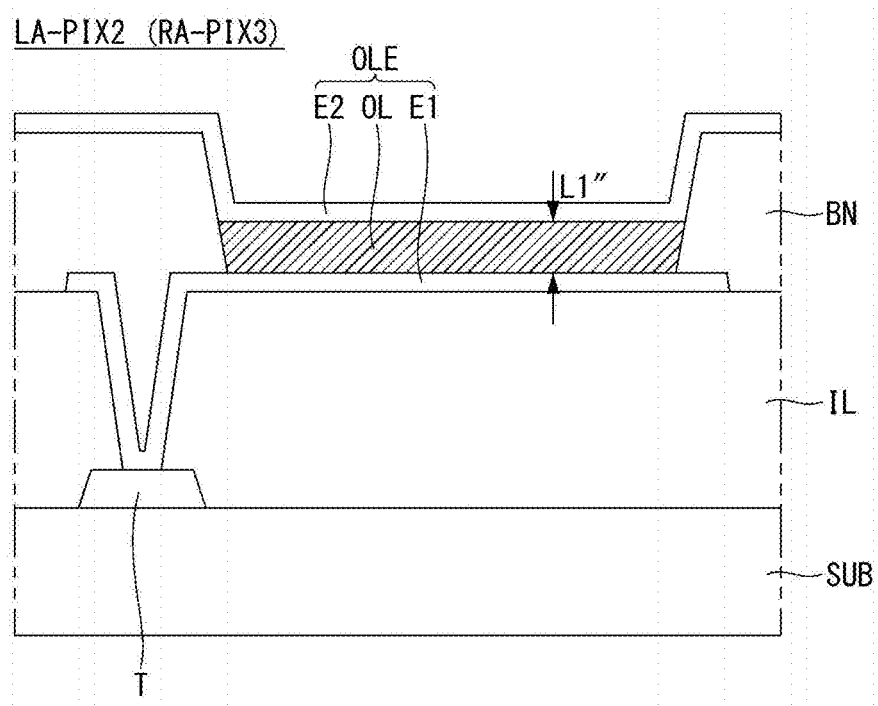
Figure 12:
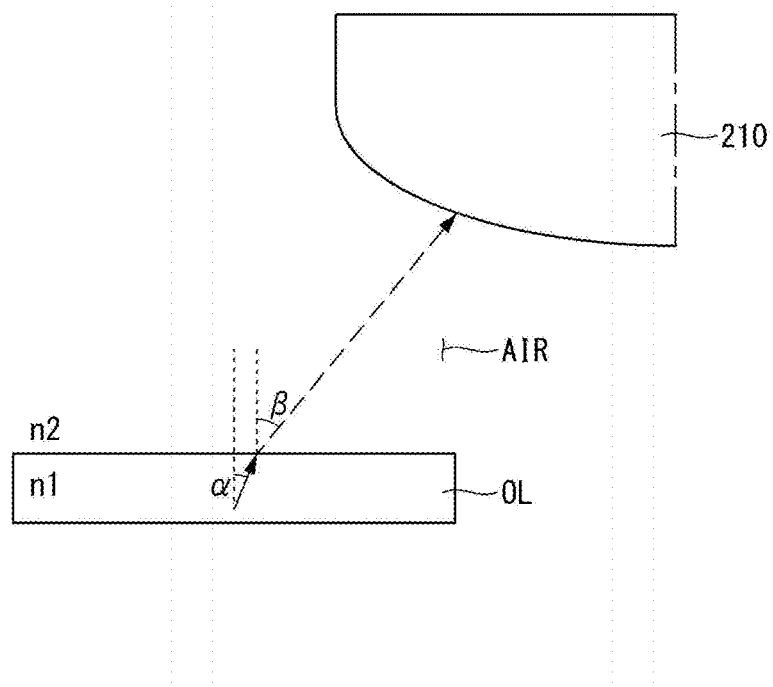
FIG. 12 is a view illustrating a path of light entering the projection lens.
Figure 13:
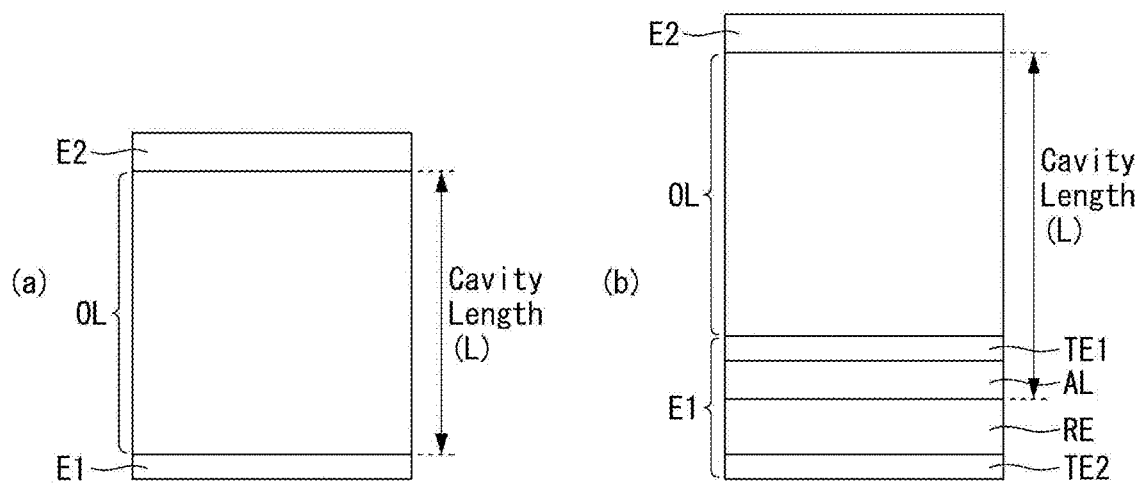
FIG. 13 is a cross-sectional view illustrating a modified example of the cavity structure.

FIGS. 10 and 11 are schematic cross-sectional views of structures of first and second pixels with different cavity thicknesses. FIG. 12 is a view illustrating a path of light entering the projection lens. FIG. 13 is a cross-sectional view illustrating a modified example of the cavity structure.

Referring to FIGS. 10 and 11, the first pixel PIX1 in the A area CA and the second pixel PIX2 in the B area LA (or the third pixel PIX3 in the C area RA) each comprise a thin-film transistor T located on the substrate SUB and an organic light-emitting diode OLE connected to the thin-film transistor T. An insulating layer IL is interposed between the thin-film transistor T and the organic light-emitting diode OLE. The first pixel PIX1 and the second pixel PIX2 emit light of the same color.

The organic light-emitting diode OLE comprises a first electrode E1, a second electrode E2, and an organic light compound layer OL interposed between the first electrode E1 and the second electrode E2. A cavity structure is used in the organic light-emitting diode OLE of the first and second pixels PIX1 and PIX2. The first electrode E1 of the organic light-emitting diode OLE may function as a reflective electrode, and the second electrode E2 may function as a semi-transmissive electrode. A micro-cavity effect is created due to constructive interference between the first electrode E1 and the second electrode E2. The first pixel PIX1 and the second pixel PIX2 have different cavity thicknesses L1' ad L1", respectively. That is, the cavity thickness L1" of the first second pixel PIX2 is different from the cavity thickness L1' of the first pixel PIX1, in consideration of the light distribution characteristics. The difference between the cavity thickness L1' of the first pixel PIX1 and the cavity thickness L1" of the second pixel PIX2 may range from 5 to 50 nm, but is not limited to this range.

More specifically, the cavity thickness may be determined by the following Equation 1. When there are two mirrors, a resonance occurs in a standing wave (or stationary wave) condition corresponding to the gap between the mirrors, which is called Fabry-Perot cavity. An organic light-emitting diode with two mirrors satisfies the Fabry-Perot interference condition in the medium. In summary, the following Equation 1 may be derived:

$$2kL\cos\theta = \frac{4\pi}{\lambda}L\cos\theta - 2m\pi \qquad \text{[Equation 1]}$$

wherein L is cavity thickness, and θ is the angle of tilt from the front towards where light is directed. λ is the central wavelength of the emission spectrum. k is the wave vector of the medium, where k=nω/c or k=2π/λ. Here, ω is pulsation, and n is refractive index. M is the number of cavities in the medium (which is a constant like 1, 2, 3 . . . ).

For example, provided that the central wavelength of the emission spectrum is 460 nm, the reference cavity thickness L1' required when light is directed towards the front (θ=°0) may be 230 nm. Here, it is assumed that m, the number of cavities in the medium, is 1, and the less the number of cavities, the higher the efficiency of the organic light-emitting diode.

Under the same condition, the adjusted cavity thickness L1" should be approximately 252 nm so that light is directed at a tilt of 28.7° (θ=28.7° from the front. It means that the amount of light directed at a tilt of 28.7° from the front can be increased by making the cavity thickness L" approximately 22 nm larger than the reference cavity thickness L1.

Referring to FIG. 12, the light emitted from the organic compound layer OL passes through at least one medium having different refractive indices and enters the projection lens 210. For example, the light emitted from the organic compound layer OL may be refracted at the interface between mediums having different refractive indices n1 and n2, because of an air layer AIR formed between the display panel 100 and the projection lens 210. Thus, the refractive indices n1 and n2 of the mediums on the optical path should be taken into consideration, in order that the light emitted from the organic compound layer OL arrives precisely at a preset position on the projection lens 210. That is, the direction in which light is directed can be adjusted using Snell's Law as shown in Equation 2:

$$n_1 \sin\theta_\alpha = n_2 \sin\theta_\beta \qquad \text{[Equation 2]}$$

Referring to FIG. 13, the cavity thickness L may be adjusted in various ways. In an example, the cavity thickness L may be adjusted by varying the thickness of the organic compound layer OL interposed between the first electrode E1 and the second electrode E2. The organic compound layer OL may include common layers such as a hole injection layer, a hole transport layer, an electron transport layer, and an electron injection layer. The cavity thickness L may be adjusted by varying the thickness of one of these layers.

In another example, the first electrode E1 may be composed of a stack of a plurality of layers including a reflective layer. The cavity thickness L may be adjusted by adding a dielectric layer AL to the top of the reflective layer RE facing the second electrode E2. For example, the first electrode E1 may be composed of a stack of an upper transparent conductive layer TE1, a reflective layer RE, and a lower transparent conductive layer TE2, and the cavity thickness L may be adjusted by adding a dielectric layer AL between the upper transparent conductive layer TE1 and the reflective layer RE. The cavity thickness L may be controlled by the presence or absence of the dielectric layer AL or the thickness of the dielectric layer AL. The upper transparent conductive TE1 and the lower transparent conductive layer TE2 may be, but not limited to, ITO. The reflective layer RE may be, but not limited to, an Ag alloy.

While the foregoing description has been given with respect to an organic compound layer OL that emits light of red (R), green (G), and blue (B) for a full-color representation on the display panel 100, the present disclosure is not limited to this. For example, the display panel 100 may comprise an organic compound layer OL that emits white light (W) and color filters of red (R), green (G), and blue (B). In this case, the white light W emitted from the organic compound layer OL passes through the red (R), green (G), and blue (B) color filters corresponding to red (R), green (G), and blue (B) subpixels, thus representing red (R), green (G), and blue (B) colors.

Although not shown, the organic compound layer OL that emits white light (W) may have a multi-stack structure such as a two-stack structure. The two-stack structure may comprise a charge generation layer located between the first electrode E1 and the second electrode E2 and first and second stacks respectively located on the bottom and top of the charge generation layer interposed between them. Each of the first and second stacks comprises an emission layer, and may further comprise at least one of common layers such as a hole injection layer, a hole transport layer, an electron transport layer, and an electro injection layer. The emission layer of the first stack and the emission layer of the second stack may comprise light-emitting materials of different colors, respectively. One of the emission layers of the first and second stacks may comprise, but not limited to, a blue light-emitting material, and the other may comprise, but not limited to, a yellow light-emitting material.

Figure 14:
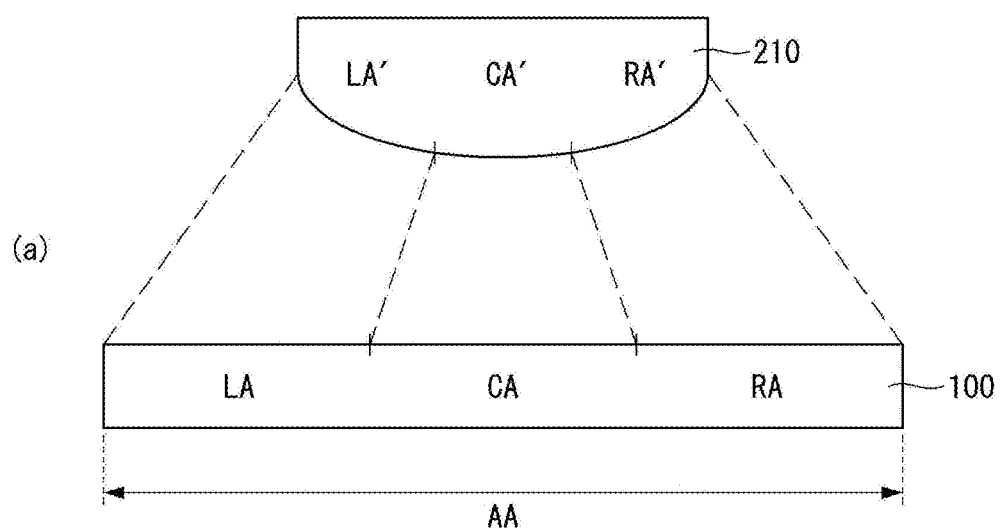
FIG. 14 is a view illustrating the relationship between the projection lens and the display panel, in a configuration comprising an organic compound layer emitting white light and color filters.
Figure 14:
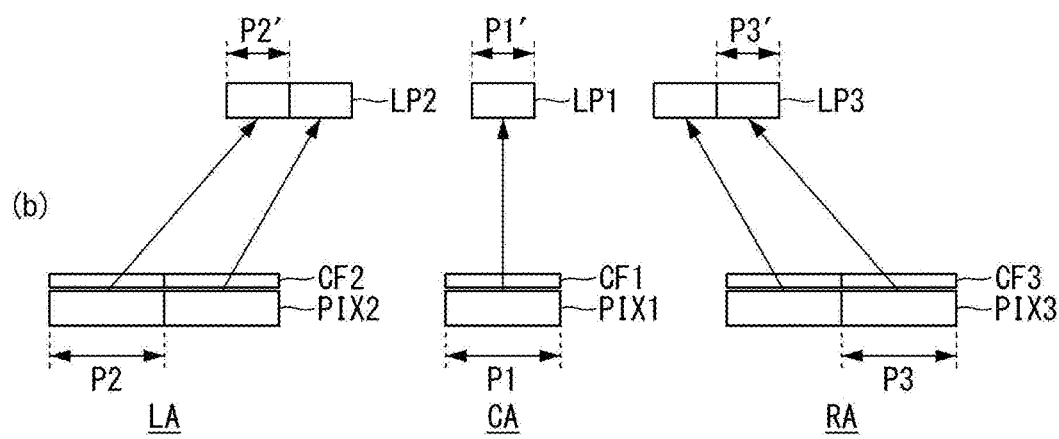

FIG. 14 is a view illustrating the relationship between the projection lens and the display panel, in a configuration comprising an organic compound layer emitting white light and color filters.

Referring to FIG. 14, some of the light delivered from the pixel PIX in the A area CA is directed towards the A' area CA' of the projection lens 210. Light emitted from the first pixel PIX1 with a preset pitch P1 and traveling toward the projection lens 210 is controlled to enter a first lens portion LP1 allocated for the first pixel PIX1 and having a preset pitch P1'. The orientation direction in which the light emitted from the first pixel PIX1 is directed may be controlled. For example, the light emitted from the first pixel PIX1 may be directed toward the front. Thus, the light emitted from a pixel PIX adjacent to the first pixel PIX1 enters the first lens portion LP1 through a color filter CF1.

The B area LA may be defined on the left side of the A area CA. Part of the light delivered from the pixel PIX in the B area LA is directed towards the B' area LA' of the projection lens 210. Light emitted from the second pixel PIX2 with a preset pitch P2 and traveling toward the projection lens 210 is controlled to enter a second lens portion LP2 allocated for the second pixel PIX2 and having a preset pitch P2'. The orientation direction in which the light emitted from the second pixel PIX2 is directed may be controlled. For example, the light emitted from the second pixel PIX2 may be tilted to the right at a preset angle θ1 from the front. Thus, the light emitted from a pixel PIX adjacent to the second pixel PIX2 enters the second lens portion LP2 through a color filter CF2. Since the organic light-emitting diode of the second pixel PIX2 and the color filter CF2 are located very close to each other, there is no need to shift the color filter CF2 to the right in consideration of the direction in which the light emitted from the organic light-emitting diode is directed.

The C area RA may be defined on the right side of the A area CA. Some of the light delivered from the pixel PIX in the C area RA is directed towards the C' area RA' of the projection lens 210. Light emitted from the third pixel PIX3 with a preset pitch P3 and traveling toward the projection lens 210 is controlled to enter a third lens portion LP3 allocated for the third pixel PIX3 and having a preset pitch P3'. The orientation direction in which the light emitted from the third pixel PIX3 is directed may be controlled. For example, the light emitted from the third pixel PIX3 may be tilted to the left at a preset angle θ2 from the front. Thus, the light emitted from a pixel PIX adjacent to the third pixel PIX3 enters the third lens portion LP3 through a color filter CF3. Since the organic light-emitting diode of the third pixel PIX3 and the color filter CF3 are located very close to each other, there is no need to shift the color filter CF3 to the left in consideration of the direction in which the light emitted from the organic light-emitting diode is directed.

In an exemplary aspect of the present disclosure, pixels that emit light of a first color may all have different thicknesses depending on their position, because of the direction in which light is directed and the light distribution characteristics, but not limited to them. That is, the pixels that emit light of the first color may be divided into a plurality of groups each comprising two or more adjacent pixels. The pixels in the same group may have the same cavity thickness, and the pixels in different groups—for example, the pixels in a first group and the pixels in a second group—may have different cavity thicknesses.

Pixels that emit light of a second color may all have different thicknesses depending on their position, because of the direction in which light is directed and the light distribution characteristics, but not limited to them. That is, the pixels that emit light of the second color may be divided into a plurality of groups each comprising two or more adjacent pixels. The pixels in the same group may have the same cavity thickness, and the pixels in different groups—for example, the pixels in a first group and the pixels in a second group—may have different cavity thicknesses.

Pixels that emit light of a third color may all have different thicknesses depending on their position, because of the direction in which light is directed and the light distribution characteristics, but not limited to them. That is, the pixels that emit light of the third color may be divided into a plurality of groups each comprising two or more adjacent pixels. The pixels in the same group may have the same cavity thickness, and the pixels in different groups—for example, the pixels in a first group and the pixels in a second group—may have different cavity thicknesses.

The exemplary aspect of the present disclosure can make the personal immersive device more lightweight and smaller by reducing the size of the projection lens constituting the optical system. Therefore, the user convenience of the personal immersive device may be improved. Moreover, the present disclosure provides a personal immersive device that can be made small and lightweight and minimize light loss by varying the cavity structure of each pixel depending on their position.

Through the above description, those skilled in the art will appreciate that various modifications and changes are possible, without departing from the scope and spirit of the disclosure. Therefore, the technical scope of the present disclosure should be defined by the appended claims rather than the detailed description of the specification.

What is claimed is:

1. A personal immersive device, comprising:
a display panel having an active area where first, second and third sub-pixels are disposed; and
a projection lens disposed on the display panel and having a first lens portion allocated for the first sub-pixel and a second lens portion allocated for the second sub-pixel,
wherein the first, second and third sub-pixels each include a first electrode, a second electrode, and an organic compound layer interposed between the first electrode and the second electrode and the first and second sub-pixels emitting a same color light, and
wherein a first distance between the first and second electrodes of the first sub-pixel is different from a second distance between the first and second electrodes of the second sub-pixel and a third distance between the first and second electrodes of the third sub-pixel is different from the first and second distances.

2. The personal immersive device of claim 1, wherein the first sub-pixel has a light distribution characteristic different from a light distribution characteristic of the second sub-pixel.

3. The personal immersive device of claim 1, wherein the first sub-pixel has a light distribution characteristic with a maximum amount of light traveling towards a direction to a user, and the second sub-pixel has a light distribution characteristic with a maximum amount of light traveling towards the direction to the user at a tilted angle.

4. The personal immersive device of claim 1, wherein the active area includes an effective area overlapping the projection lens and an ineffective area not overlapping the projection lens.

5. The personal immersive device of claim 4, wherein the effective area is defined at the active area.

6. The personal immersive device of claim 4, wherein the effective area is defined at a center of the active area.

7. The personal immersive device of claim 1, wherein the display panel further comprises a plurality of color filers, and the light emitted from the organic compound layer enters the projection lens through the color filters.

8. The personal immersive device of claim 1, wherein the display panel further comprises:
a first group including a plurality of first sub-pixels; and
a second group including a plurality of second sub-pixels,
wherein the first distance between the first and second electrodes of the plurality of first sub-pixels in the first group is same, and
wherein the plurality of second sub-pixels in the second group has a same cavity thickness.

9. The personal immersive device of claim 1, wherein the organic compound layer comprises:
an emission layer; and
at least one of a hole injection layer, a hole transport layer, an electron transport layer, and an electron injection layer as a common layer,
wherein the common layer of the first sub-pixel and the common layer of the second sub-pixel have different thicknesses.

10. The personal immersive device of claim 1, wherein the first electrode includes a reflective layer and a transparent conductive layer disposed on the reflective layer, and
wherein one of the first sub-pixel and the second sub-pixel includes a dielectric layer disposed between the reflective layer and the transparent conductive layer.

11. The personal immersive device of claim 1, wherein the first electrode of the first and the second sub-pixels includes a reflective layer, a transparent conductive layer disposed on the reflective layer and a dielectric layer disposed between the reflective layer and the transparent conductive layer,
wherein the dielectric layer of the first sub-pixels and the dielectric layer of the second sub-pixel have different thicknesses.

12. The personal immersive device of claim 1, wherein the first electrode is a reflective electrode, and the second electrode is a semi-transmissive electrode.

13. The personal immersive device of claim 1, further comprising an optical guiding portion that guides the light delivered from the projection lens to user's eyes.

* * * * *